(12) United States Patent
Yen et al.

(10) Patent No.: US 12,054,385 B2
(45) Date of Patent: Aug. 6, 2024

(54) STRESS ISOLATION USING THREE-DIMENSIONAL TRENCHES

(71) Applicant: Texas Instruments Incorporated, Dallas, TX (US)

(72) Inventors: Ting-Ta Yen, San Jose, CA (US); Jeronimo Segovia-Fernandez, San Jose, CA (US); Ricky Alan Jackson, Richardson, TX (US); Benjamin Cook, Los Gatos, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/388,301

(22) Filed: Jul. 29, 2021

(65) Prior Publication Data
US 2022/0242722 A1 Aug. 4, 2022

Related U.S. Application Data

(60) Provisional application No. 63/143,650, filed on Jan. 29, 2021.

(51) Int. Cl.
*B81B 7/00* (2006.01)

(52) U.S. Cl.
CPC .... *B81B 7/0048* (2013.01); *B81B 2201/0271* (2013.01); *B81B 2203/033* (2013.01)

(58) Field of Classification Search
CPC .......... B81B 7/0048; B81B 2201/0271; B81B 2203/033
See application file for complete search history.

(56) References Cited

U.S. PATENT DOCUMENTS

| | | | |
|---|---|---|---|
| 6,870,445 B2 | 3/2005 | Kawakubo | |
| 7,834,524 B2 | 11/2010 | Wang | |
| 7,868,448 B2 | 1/2011 | Metzger | |
| 7,888,843 B2 | 2/2011 | Ayazi | |
| 9,735,338 B2 | 8/2017 | Guillou | |
| 9,876,483 B2 | 1/2018 | Ortiz | |
| 10,594,286 B2 | 3/2020 | Chang | |
| 11,075,613 B2 | 7/2021 | Murakami | |
| 2006/0170519 A1 | 8/2006 | Thalhammer | |
| 2007/0125161 A1* | 6/2007 | Bryzek | B81B 3/0086 73/146.4 |
| 2012/0049298 A1* | 3/2012 | Schlarmann | B81B 7/0048 438/51 |
| 2017/0033766 A1 | 2/2017 | Jacobsen | |
| 2018/0109237 A1 | 4/2018 | Wasilik | |
| 2019/0165756 A1 | 5/2019 | Murakami | |

FOREIGN PATENT DOCUMENTS

DE 102017203381 A1 * 4/2018

OTHER PUBLICATIONS

Federal Institute of Industrial Property, International Search Report in corresponding PCT Application No. PCT/US2020/027946, mailed Jul. 2, 2020 (2 pages).

* cited by examiner

*Primary Examiner* — Samuel A Gebremariam
(74) *Attorney, Agent, or Firm* — Frank D. Cimino

(57) ABSTRACT

A semiconductor system includes a substrate. The substrate has a front side and a back side. A device is formed on the front side of the substrate. A vertical spring is etched in the substrate about the device. A trench is etched in the front side of the substrate about the device. A wall of the trench forms a side of the vertical spring.

18 Claims, 3 Drawing Sheets

STRESS ISOLATION USING THREE-DIMENSIONAL TRENCHES

CROSS-REFERENCE TO RELATED APPLICATION

This application claims priority to U.S. Provisional Application 63/143,650, filed Jan. 29, 2021, titled "Stress Isolation Using Front-Side and Back-Side 3D Trenches," which is hereby incorporated by reference in its entirety.

BACKGROUND

Microelectromechanical systems (MEMS) are used in a wide variety industrial and consumer products. Examples of MEMS devices include inkjet printer heads, accelerometers, gyroscopes, oscillators, microphones, pressure sensors, digital micromirror devices, and many other devices. Packaging is typically required to enable application of the diverse array of MEMS devices in higher level systems. While packaging is intended to provide protection to a MEMS device, many MEMS devices and electronic circuits are sensitive to package-induced stress.

SUMMARY

Semiconductor dice including vertical springs for stress isolation are described herein. In one example, a semiconductor system includes a substrate. The substrate has a front side and a back side. A device is formed on the front side of the substrate. A vertical spring is etched in the substrate about the device.

In another example, a microelectromechanical system (MEMS) resonator includes a substrate. The substrate has a front side and a back side. A MEMS device is formed on the front side of the substrate. A trench is etched in the front side of the substrate about the MEMS device. A wall of the trench forms a side of a vertical spring.

In a further example, a method for fabricating a semiconductor system includes etching a vertical spring in a substrate. The vertical spring encompasses a device formed on the front side of the substrate. A cap wafer is bonded to the front side of the substrate. The cap wafer is disposed over the device and the vertical spring.

DETAILED DESCRIPTION

Packaged induced stress can greatly impact the performance of precision MEMS devices, such as MEMS oscillators, frequency references, inertial sensors, etc. Similarly, performance of precision integrated circuits is affected by package induced stress. Various techniques are employed to isolate a semiconductor system (a MEMS device or an integrated circuit) from package-induced stress. For example, wafer-level packaging is used to isolate stresses from the front side of the MEMS device, silicon trenches formed around the MEMS device reduce lateral stresses, and a backside release, backside etch, or sacrificial layer may be used to relieve stress from the back side of the MEMS device.

Significant reduction in stress can be obtained by releasing the MEMS structure from the underlying substrate (e.g., coupling the MEMS structure to the substrate via anchors or springs). However, such techniques are costly and may damage the MEMS device during release etching. Moreover, in the presence of pressure differences, a released MEMS device may be damaged or destroyed.

The semiconductor systems described herein include three-dimensional (3D) trenches in the substrate thereof that can provide stress isolation without a through etch. The 3D trenches form vertical springs that provide stress isolation. Because no through etch is performed, the device surface does not interact with etchant (etching gas), and the etchant does not damage the MEMS device.

Figure 1:
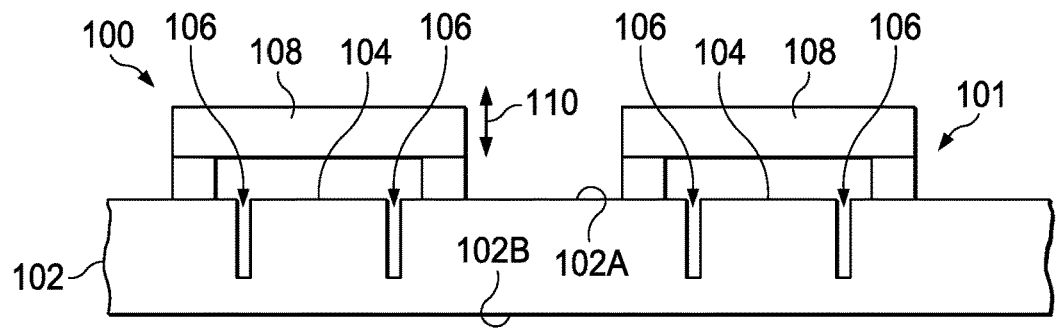
FIG. 1 shows a cross-sectional view of a wafer.

FIG. 1 shows a cross-sectional view of a wafer processed to include vertical springs. A substrate 102 (e.g., a silicon substrate) has a front side 102A and back side 102B. Multiple instance of a device 104 may be formed on the front side 102A of the substrate 102. In FIG. 1, semiconductor systems 100 and 101 are illustrated, each including an instance of the device 104 formed on the front side 102A of the substrate 102. The device 104 may be an electronic circuit (e.g., a reference voltage circuit or other circuit) or a MEMS device, such as a MEMS resonator (e.g., a bulk acoustic wave resonator). A trench 106 (a 3D trench) is etched (e.g., wet or dry etch) in the substrate 102 about the device 104. For example, a masking material, such as photoresist, is deposited on the substrate 102 and a chemical etchant is applied to the substrate 102 to form the trench 106. The trench 106 may encompass or surround the device 104 but for one or more unetched areas provided for routing of signal conductors between the device 104 and terminals outside the trench 106.

A cap wafer 108 is bonded to the front side of the substrate 102 over the device 104 and the trench 106 to provide front side stress isolation. That is, the cap wafer 108 relieves the device 104 from stress presented in the Z-direction 110.

Figure 2:
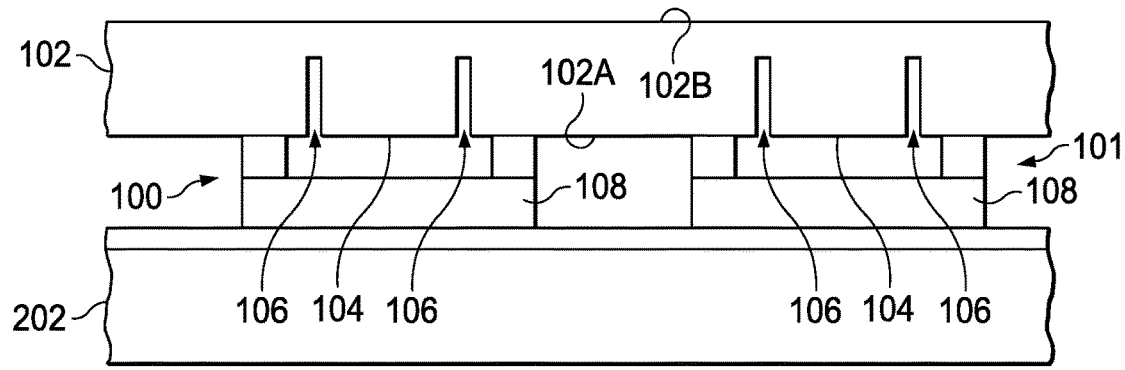
FIG. 2 shows a cross-sectional view of the wafer of FIG. 1 bonded to a temporary wafer.

FIG. 2 shows a cross-sectional view of the wafer of FIG. 1 bonded to a temporary wafer. More specifically, FIG. 2 shows that the cap wafer 108 is bonded to a temporary wafer 202 to allow for etching of the back side 102B of the substrate 102.

Figure 3:
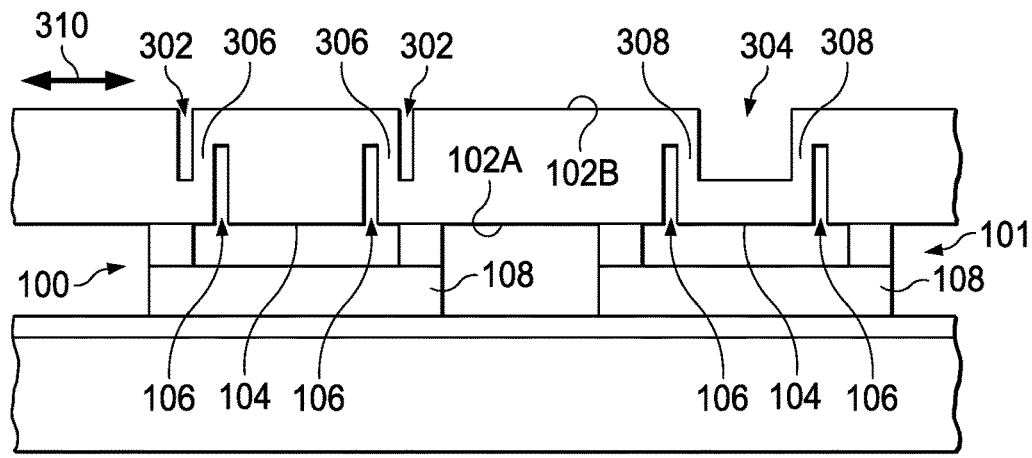
FIG. 3 shows the wafer of FIG. 2 etched to form a vertical spring for stress isolation.

FIG. 3 shows the wafer of FIG. 2 with back side etching of the substrate 102. In the semiconductor system 100, a trench 302 (a 3D trench) is etched (e.g., dry etch) in the back side 102B of the substrate 102. The trench 302 is radially offset from the trench 106. In FIG. 3, the trench 302 is illustrated as outside the trench 106. In some implementations of the semiconductor system 100, the trench 302 may be etched inside the trench 106. The trench 106 and the trench 302 are etched to a depth such that the trench 302 overlaps the trench 106. Neither the trench 106, nor the trench 302, forms a passage from the front side 102A to the back side 102B of the substrate 102. Because there is no passage between the front side 102A and the back side 102B, the front side 102A is isolated from the back side 102B, and etchant applied to form the trench 302 cannot damage the device 104. The area of the substrate 102 between the trench 106 and the trench 302 forms a vertical spring 306. A wall of the trench 106 forms a first side of the vertical spring 306, and a wall of the trench 302 forms a second side of the vertical spring 306. The vertical spring 306 isolates the device 104 of the semiconductor system 100 from stress in-plane with the substrate 102 (e.g., in a direction 310).

In the semiconductor system 101, a cavity 304 is etched (e.g., dry etch) in the back side 102B of the substrate 102. The cavity 304 is formed opposite the device 104 and inside the trench 106. The trench 106 and the cavity 304 are etched to a depth such that the cavity 304 overlaps the trench 106. Neither the trench 106, nor the cavity 304, forms a passage from the front side 102A to the back side 102B. Because there is no passage between the front side 102A and the back side 102B, etchant applied to form the cavity 304 cannot damage the device 104. The area of the substrate 102 between the trench 106 and the cavity 304 forms a vertical spring 308. A wall of the trench 106 forms a side of the vertical spring 308, and a wall of the cavity 304 forms a side of the vertical spring 308. The vertical spring 308 isolates the device 104 of the semiconductor system 101 from stress in-plane with the substrate 102 (e.g., in a direction 310).

Figure 4:
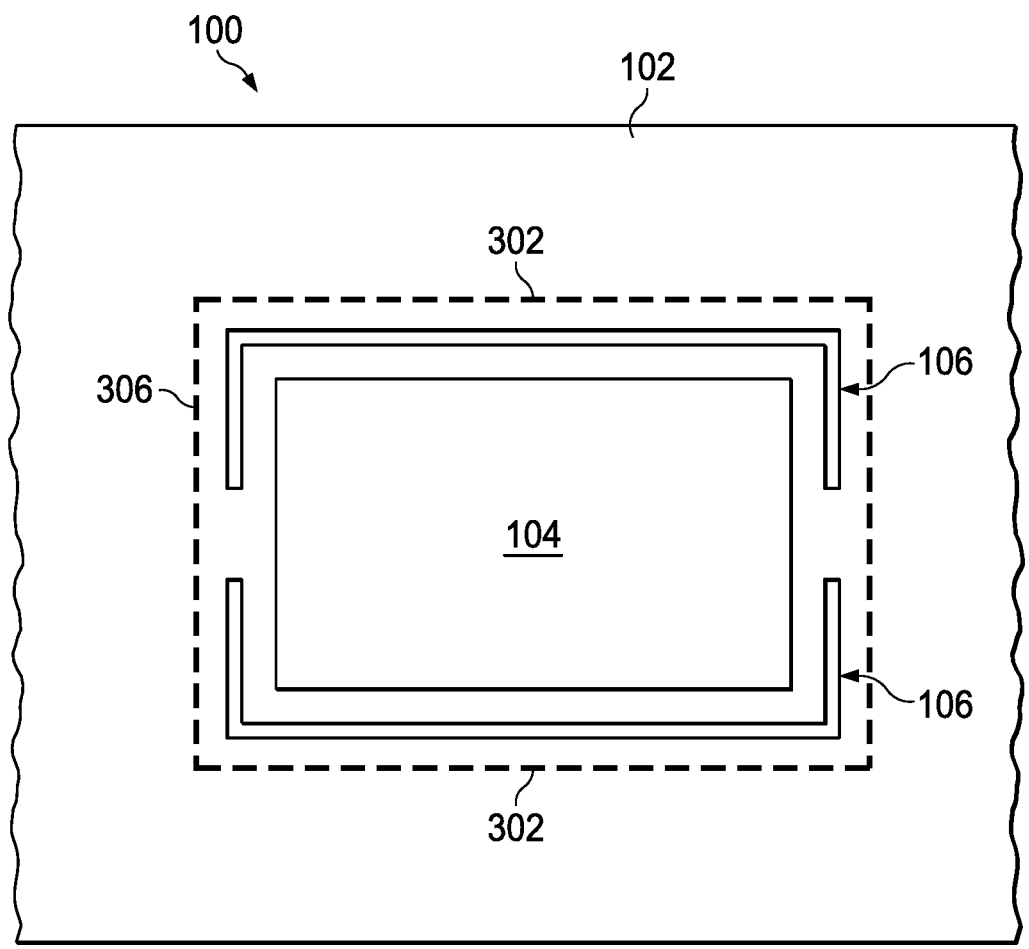
FIG. 4 shows a top view of a die that includes a vertical spring formed by front and back side trenches.

FIG. 4 shows a top view of a die that includes a vertical spring formed by front and back side trenches. The trench 106 encompasses the device 104, and the trench 302 encompasses the trench 106 to form the vertical spring 306.

Figure 5:
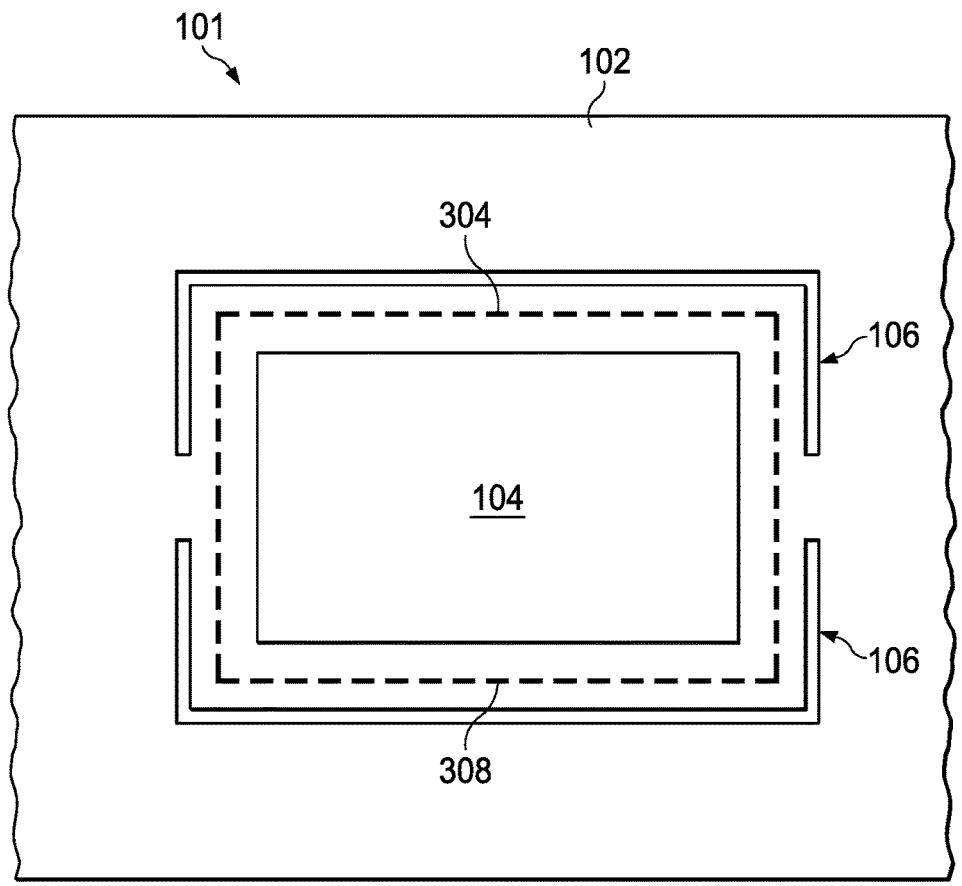
FIG. 5 shows a top view of a die that includes a vertical spring formed by a front side trench and a back side cavity.

FIG. 5 shows a top view of a die that includes a vertical spring formed by a front side trench and a back side cavity. The trench 106 encompasses the device 104, and the trench 106 encompasses the cavity 304 form the vertical spring 308.

Figure 6:
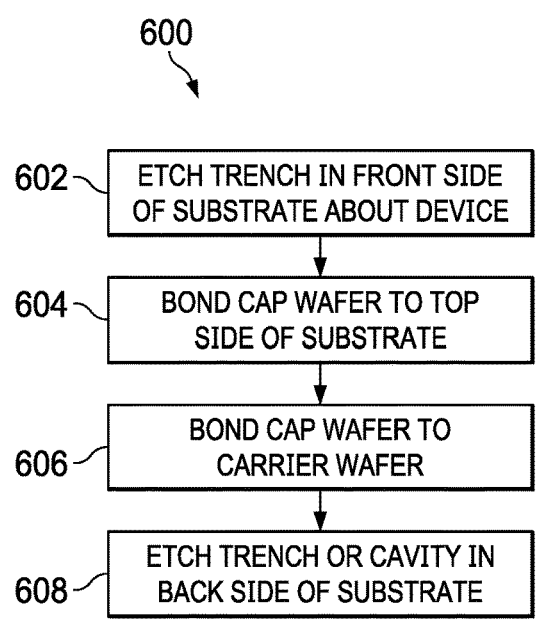
FIG. 6 shows a flow diagram for a method for fabricating a semiconductor device that includes a vertical spring for stress isolation.

FIG. 6 shows a flow diagram for a method 600 for fabricating a semiconductor device with a vertical spring. Though depicted sequentially as a matter of convenience, at least some of the actions shown can be performed in a different order and/or performed in parallel. Additionally, some implementations may perform only some of the actions shown.

In block 602, the trench 106 is etched in the front side 102A of the substrate 102 about the device 104. The trench 106 encompasses the device 104.

In block 604, the cap wafer 108 is bonded to the substrate 102. The cap wafer 108 covers the device 104 and the trench 106. The cap wafer 108 isolates the device 104 from stress presented in a direction orthogonal to the plane of the substrate 102.

In block 606, the cap wafer 108 is bonded to the temporary wafer 202 (a carrier wafer) to allow the back side 1026 to be etched.

In block 608, the back side 1026 of the substrate 102 is etched to form a trench or cavity, and thereby form a vertical spring in the substrate 102. The trench 302 may be etched in the back side 102B of the substrate 102 to form the vertical spring 306. In some implementations, the cavity 304 is etched in the back side 102B of the substrate 102 opposite the device 104 to form the vertical spring 308.

The cap wafer 108 is separated from the temporary wafer 202, and the semiconductor system 100 and/or semiconductor system 101 are singulated by sawing, breaking, laser cutting, etc. After singulation, the semiconductor system 100 or the semiconductor system 101 may be bonded to a lead frame and packaged.

Modifications are possible in the described embodiments, and other embodiments are possible, within the scope of the claims.

What is claimed is:

1. A semiconductor device, comprising:
   a semiconductor substrate having opposing first and second surfaces;
   a first trench extending from the first surface into the semiconductor substrate, the first trench having a first bottom surface in the semiconductor substrate; and
   a second trench extending from the second surface into the semiconductor substrate and having a second bottom surface in the semiconductor substrate.

2. The semiconductor device of claim 1, wherein the semiconductor substrate includes a portion extending between the first and second surfaces, and the portion is adjacent to the first trench and the second trench.

3. The semiconductor device of claim 2, wherein the portion forms at least part of a spring.

4. The semiconductor device of claim 1, further comprising a device on the semiconductor substrate and adjacent to at least one of the first or second trenches.

5. The semiconductor device of claim 4, wherein the device is on the first surface, the first trench surrounds at least a part of the device, and the second trench surrounds at least a part of a footprint of the device on the second surface.

6. The semiconductor device of claim 4, further comprising a cap structure on the first surface and over the device.

7. The semiconductor device of claim 4, wherein the semiconductor substrate further comprises:
   a third trench extending from the first surface into the semiconductor substrate, the first and third trenches being on two sides of the device, and the third trench having a third bottom surface in the semiconductor substrate; and
   a cavity extending from the second surface, the cavity having a bottom surface opposing the device.

8. The semiconductor device of claim 1, wherein the second trench surrounds at least a part of a footprint of the first trench on the second surface.

9. The semiconductor device of claim 1, wherein the first trench surrounds at least a part of a footprint of the second trench on the first surface.

10. The semiconductor device of claim 1, wherein the device includes at least one of: a microelectromechanical system, a bulk acoustic wave (BAW) resonator, or a circuit.

11. A system, comprising:
    a semiconductor substrate having opposing first and second surfaces;
    a micromechanical system (MEMS) device on the first surface;
    a first trench extending from the first surface into the semiconductor substrate, the first trench having a first bottom surface in the semiconductor substrate; and
    a second trench extending from the second surface into the semiconductor substrate and having a second bottom surface in the semiconductor substrate.

12. The system of claim 11, wherein the semiconductor substrate includes a portion extending between the first and second surfaces, and the portion abuts the first trench and the second trench.

13. The system of claim 11, wherein the semiconductor substrate further comprises:
    a third trench extending from the first surface into the semiconductor substrate, the first and third trenches being on two sides of the MEMS device, and the third trench having a third bottom surface in the semiconductor substrate; and
    a cavity extending from the second surface, the cavity having a bottom surface opposing the MEMS device.

14. The system of claim 11, wherein the first trench surrounds at least a part of the MEMS device, and the second trench surrounds at least a part of a footprint of the MEMS device on the second surface.

15. The system of claim 11, wherein the second trench surrounds at least a part of a footprint of the first trench on the second surface.

16. The system of claim 11, further comprising a cap structure bonded to the first surface over the MEMS device.

17. The system of claim 11, wherein the first trench surrounds at least a part of a footprint of the second trench on the first surface.

18. The system of claim 11, wherein the MEMS device includes a bulk acoustic wave (BAW) resonator.

* * * * *